(12) United States Patent
Chang et al.

(10) Patent No.: US 11,260,365 B2
(45) Date of Patent: Mar. 1, 2022

(54) RISER BRACKET FOR SUPPORTING A COMPUTER CARD

(71) Applicant: Quanta Computer Inc., Taoyuan (TW)

(72) Inventors: Chun Chang, Taoyuan (TW);
Shih-Hsuan Hu, Taoyuan (TW);
Wei-Cheng Tseng, Taoyuan (TW);
Cheng-Feng Tsai, Taoyuan (TW)

(73) Assignee: QUANTA COMPUTER INC., Taoyuan (TW)

( * ) Notice: Subject to any disclaimer, the term of this patent is extended or adjusted under 35 U.S.C. 154(b) by 63 days.

(21) Appl. No.: 16/997,502

(22) Filed: Aug. 19, 2020

(65) Prior Publication Data

US 2021/0357005 A1 Nov. 18, 2021

Related U.S. Application Data

(60) Provisional application No. 63/025,677, filed on May 15, 2020.

(51) Int. Cl.
| | |
|---|---|
| *H05K 1/18* | (2006.01) |
| *B01J 20/28* | (2006.01) |
| *B01J 20/12* | (2006.01) |
| *B01J 20/02* | (2006.01) |
| *B01J 20/10* | (2006.01) |

(Continued)

(52) U.S. Cl.
CPC ..... *B01J 20/28016* (2013.01); *B01J 20/0229* (2013.01); *B01J 20/0248* (2013.01); *B01J 20/103* (2013.01); *B01J 20/12* (2013.01); *B01J 20/261* (2013.01); *C02F 1/288* (2013.01); *C02F 1/5245* (2013.01); *C02F 1/705* (2013.01); *C02F 1/72* (2013.01); *G06F 1/184* (2013.01); *H05K 1/14* (2013.01); *C02F 1/281* (2013.01); *C02F 1/285* (2013.01); *C02F 2101/105* (2013.01); *C02F 2101/16* (2013.01);

(Continued)

(58) Field of Classification Search
CPC .............. B01J 20/28016; B01J 20/0229; B01J 20/103; B01J 20/12; B01J 20/261; B01J 20/288; C02F 1/5245; C02F 1/705; C02F 1/72; C02F 1/281; C02F 1/285; C02F 2101/105; C02F 2101/16; C02F 2101/163; C02F 2103/001; C02F 2103/06; G06F 1/184; H05K 1/14
See application file for complete search history.

(56) References Cited

U.S. PATENT DOCUMENTS

| | | | | |
|---|---|---|---|---|
| 8,174,835 | B2 * | 5/2012 | Kim | H05K 7/1461 361/737 |
| 8,295,060 | B2 * | 10/2012 | Liu | G06F 1/185 361/800 |
| 8,514,585 | B2 * | 8/2013 | Zhang | H05K 5/0269 361/796 |

* cited by examiner

*Primary Examiner* — Binh B Tran
(74) *Attorney, Agent, or Firm* — Nixon Peabody LLP (57) ABSTRACT

A riser bracket for supporting a riser board and a computer card inserted into the riser board is disclosed. The riser bracket includes a first riser bracket piece, a first latch, a second riser bracket piece, and a second latch. The computer card and the riser board are positioned on a motherboard. The first riser bracket piece is configured to be coupled to the riser board. The first latch is configured to the first riser bracket piece to a first mounting point of the motherboard, and to move between a latched position and an unlatched position. The second riser bracket piece is coupled to the first riser bracket piece. The second latch is configured to couple the second riser bracket piece to a second mounting point of the motherboard, and move between a latched position and an unlatched position.

20 Claims, 9 Drawing Sheets

(51) Int. Cl.
*B01J 20/26* (2006.01)
*C02F 1/28* (2006.01)
*C02F 1/72* (2006.01)
*C02F 1/52* (2006.01)
*C02F 1/70* (2006.01)
*G06F 1/18* (2006.01)
*H05K 1/14* (2006.01)
C02F 103/06 (2006.01)
C02F 101/16 (2006.01)
C02F 101/10 (2006.01)
C02F 103/00 (2006.01)

(52) U.S. Cl.
CPC .. *C02F 2101/163* (2013.01); *C02F 2103/001* (2013.01); *C02F 2103/06* (2013.01)

RISER BRACKET FOR SUPPORTING A COMPUTER CARD

CROSS-REFERENCE TO RELATED APPLICATIONS

This application claims priority under 35 U.S.C. § 119 to U.S. Provisional Application No. 63/025,667, entitled "FHHL/FHFL/GPU Card Tool-less Mechanism Design," and filed on May 26, 2020. The contents of that application are hereby incorporated by reference herein in their entirety.

TECHNICAL FIELD

The present disclosure relates generally to systems and devices for securing and supporting a computer card placed onto and connected to a motherboard. More particularly, aspects of this disclosure relate to a riser bracket with latches to secure a computer card to a motherboard and to prevent inadvertent movement or removal of the computer card.

BACKGROUND

Computing devices (such as servers) generally include a housing and a variety of different electronic components positioned inside the housing. Such devices can be placed onto and connected to a motherboard, which electrically connects various components together. The motherboard is generally placed in a horizontal orientation at the bottom of the housing.

In some instances, the components can include one or more computer cards, such as GPU cards, PCIe cards, etc. Such cards can be connected to slots on the motherboard. However, in order to be inserted into a slot, the card must be vertically oriented relative to the motherboard. Since the height of the server chassis is usually limited, the size of the card is similarly limited. Depending on space constraints of the housing and the motherboard and the size of the computer cards themselves, a single computer card is often inserted into a riser board, which in turn is inserted into a connector on the motherboard. This allows the computer card to be added to the system in a horizontal orientation, e.g., in the same orientation as the motherboard. The computer cards thus do not have to be placed in a vertical orientation, and larger cards can be used.

Generally, a connector on a single edge of the computer card is inserted into a card slot of the riser board, which itself is inserted into a card slot on the motherboard. Thus, the computer card is often supported only on the single edge that is inserted into the riser board. As computer cards become more complex, they often grow larger and heavier. Because the computer cards are only supported by a single edge, heaver cards can undergo undesired movement, such as wobbling, vibration, etc., when inserted into the motherboard. Thus, new systems and devices for securing and supporting such computer cards are needed.

SUMMARY

The various examples of the present disclosure are directed toward a riser bracket for supporting a riser board and a computer card inserted into the riser board, when the riser board and the computer card are placed onto a motherboard, such that the computer card is connected to the motherboard through the riser board. In a first embodiment, the riser bracket comprises a first riser bracket piece, a first latch, a second riser bracket piece, and a second latch. The first riser bracket piece is configured to be coupled to the riser board. The first latch is configured to couple the first riser bracket piece to a first mounting point of the motherboard, and to move between a latched position and an unlatched position. The second riser bracket piece is coupled to the first riser bracket piece. The second latch is configured to couple the second riser bracket piece to a second mounting point of the motherboard, and move between a latched position and an unlatched position.

In some cases, a connector on a first edge of the computer card is configured to be inserted into the riser board, such that the first riser bracket piece supports the first edge of the computer card. In some cases, the second riser bracket piece includes a crossmember. A second edge of the computer card is configured to rest on the crossmember, such that the second riser bracket piece supports the second edge of the computer card.

In some cases, the first riser bracket piece and the second riser bracket piece are arranged generally perpendicular to each other.

In some cases, the first latch is configured to rotate between the latched position and the unlatched position.

In some cases, the first latch includes a hook portion that is configured to extend through an opening in the first mounting point of the motherboard when the first latch is in the latched position, thereby aiding in preventing the riser bracket and the computer card from being removed from the motherboard. In some cases, the first latch is biased toward the latched position. In some cases, the riser bracket further comprises a torsion spring. Movement of the first latch from the latched position to the unlatched position compresses the torsion spring, thereby biasing the first latch toward the latched position. In some cases, the first riser bracket piece includes a vertical wall and a horizontal wall extending from the vertical wall. The first latch is coupled to the vertical wall, and a top portion of the first latch extends through an opening in the horizontal wall. The top portion of the first latch is accessible by a user to move the first latch between the latched position and the unlatched position.

In some cases, the second riser bracket piece includes a horizontal wall and a vertical wall extending downward from a first end of the horizontal wall. The vertical wall is configured to be coupled to a portion of the computer card. In some cases, the vertical wall of the second riser bracket piece includes a latch protrusion extending from a first surface of the vertical wall, and a card protrusion extending from an opposing second surface of the vertical wall. In some cases, the card protrusion of the second riser bracket piece is sized to be insertable into a slot defined by the portion of the computer card to thereby couple the second riser bracket piece to the portion of the computer card. In some cases, the second latch is coupled to the second mounting point of the motherboard and includes a vertical wall that defines a slot. The slot is sized to receive the latch protrusion of the vertical wall of the second riser bracket piece therein. In some cases, when the second latch is in the latched position, the latch protrusion is received in the slot defined by the second latch to secure the second riser bracket piece. When the second latch is in the unlatched position, the latch protrusion is not received in the slot. In some cases, the second mounting point of the motherboard includes a protrusion, and the second latch includes a vertical wall that defines a channel. The channel is sized to receive the protrusion of the second mounting point of the motherboard. In some cases, the protrusion of the second mounting point of the motherboard slides within the channel defined by the vertical wall of the second latch when the second latch moves between the latched position and the unlatched position. In some cases, a second end of the horizontal wall of the second riser bracket piece is configured to be coupled to a third mounting point of the motherboard.

In some cases, the second riser bracket piece is configured to be coupled to a portion of the computer card. When the second latch is in the latched position, the second latch is coupled to both the second riser bracket piece and the second portion of the motherboard. When the second latch is in the unlatched position, the second latch is decoupled from the second riser bracket piece.

In some cases, the first riser bracket piece is configured to support a first edge of the computer card inserted into the riser board. The second riser bracket piece is configured to support a second edge of the computer card. The second riser bracket piece is configured to be coupled to: (i) a portion of the computer card; and (ii) a third mounting point of the motherboard.

In a second embodiment, a computer system comprises a housing, a motherboard, a riser board, a computer card, and a riser bracket. The motherboard is disposed within the housing. The riser board is electrically connected to the motherboard. The computer card is inserted into the riser board to electrically connect the computer card to the motherboard through the riser board. The riser bracket is configured to support the riser board and the computer card. The riser bracket includes a first riser bracket piece, a first latch, a second riser bracket piece, and a second latch. The first riser bracket piece is configured to be coupled to the riser board. The first latch is configured to the first riser bracket piece to a first mounting point of the motherboard, and to move between a latched position and an unlatched position. The second riser bracket piece is coupled to the first riser bracket piece. The second latch is configured to couple the second riser bracket piece to a second mounting point of the motherboard, and move between a latched position and an unlatched position.

The above summary is not intended to represent each embodiment or every aspect of the present disclosure. Rather, the foregoing summary merely provides an example of some of the novel aspects and features set forth herein. The above features and advantages, and other features and advantages of the present disclosure, will be readily apparent from the following detailed description of representative embodiments and modes for carrying out the present invention, when taken in connection with the accompanying drawings and the appended claims.

BRIEF DESCRIPTION OF THE DRAWINGS

The disclosure will be better understood from the following description of exemplary embodiments together with reference to the accompanying drawings.

The present disclosure is susceptible to various modifications and alternative forms. Some representative embodiments have been shown by way of example in the drawings and will be described in detail herein. It should be understood, however, that the invention is not intended to be limited to the particular forms disclosed. Rather, the disclosure is to cover all modifications, equivalents, and alternatives falling within the spirit and scope of the invention as defined by the appended claims.

DETAILED DESCRIPTION

The present inventions can be embodied in many different forms. Representative embodiments are shown in the drawings, and will herein be described in detail. The present disclosure is an example or illustration of the principles of the present disclosure, and is not intended to limit the broad aspects of the disclosure to the embodiments illustrated. To that extent, elements, and limitations that are disclosed, for example, in the Abstract, Summary, and Detailed Description sections, but not explicitly set forth in the claims, should not be incorporated into the claims, singly or collectively, by implication, inference, or otherwise. For purposes of the present detailed description, unless specifically disclaimed, the singular includes the plural and vice versa; and the word "including" means "including without limitation." Moreover, words of approximation, such as "about," "almost," "substantially," "approximately," and the like, can be used herein to mean "at," "near," or "nearly at," or "within 3-5% of," or "within acceptable manufacturing tolerances," or any logical combination thereof, for example.

The present disclosure relates to a riser bracket that can be used to secure and support a computer card when the computer card is electrically connected to a motherboard through a riser board. The riser bracket includes separate riser bracket pieces that are coupled to each other. The riser bracket pieces themselves can be coupled to various mounting points on the motherboard. The riser bracket pieces are also coupled to the computer card and/or the riser board to thereby aid in supporting the computer card. The riser bracket also includes one or more latches that are configured to move between a latched position and an unlatched position. In the latched position, the one or more latches aid in securing the computer card to the motherboard. The one or more latches also aid in prevent wobbling or other inadvertent movement of the computer card.

Figure 1A:
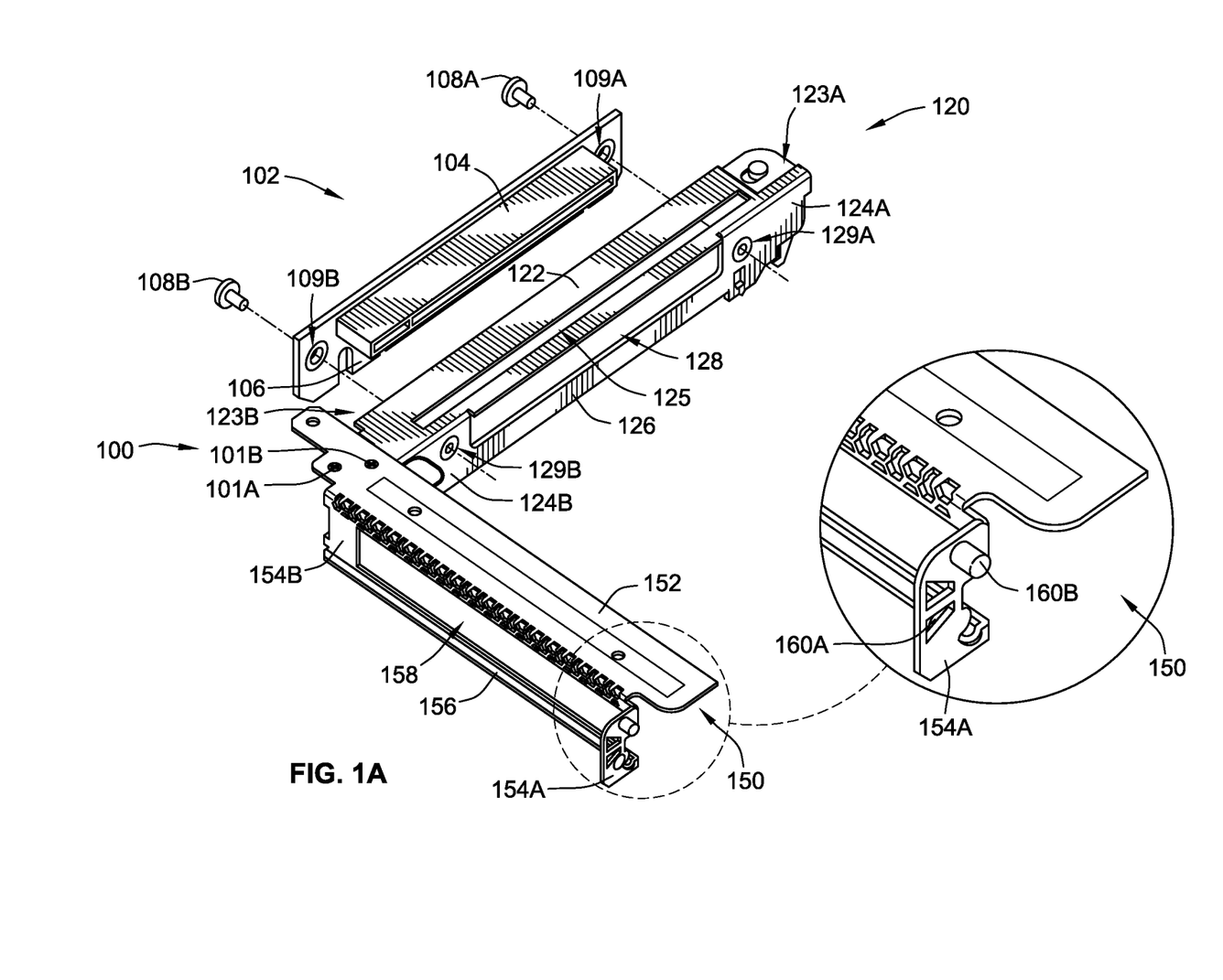
FIG. 1A is a perspective view of an example riser bracket and an example riser board for securing a computer card on a motherboard, according to aspects of the present disclosure.

FIG. 1A shows an example riser bracket 100 and riser board 102, according to aspects of the present disclosure. The riser bracket 100 includes a first riser bracket piece 120 and a second riser bracket piece 150. In some implementations, the first riser bracket piece 120 and the second riser bracket piece 150 are coupled together using one or more fasteners, such as screws, pins, clips, etc. In other implementations, the first riser bracket piece 120 and the second riser bracket piece 150 are integrally formed as a single structure.

In the illustrated implementation, the first riser bracket piece 120 and the second riser bracket piece 150 are arranged perpendicular to each other, e.g., they form an internal angle of about 90°. In other implementations, the first riser bracket piece 120 and the second riser bracket piece 150 can be arranged so that they are parallel to each other. In these implementations, the riser bracket 100 would generally include at least one crossmember coupled to both the first riser bracket piece 120 and the second riser bracket piece 150.

The first riser bracket piece 120 includes a generally horizontal wall 122 and two generally vertical walls 124A and 124B. The vertical wall 124A extends downward from a first end of the horizontal wall 122, and the vertical wall 124B extends downward from a second end of the horizontal wall 122. A crossmember 126 joins the vertical wall 124A and the vertical wall 124B. A generally rectangular opening 128 is defined between the horizontal wall 122, the vertical wall 124A, the vertical wall 124B, and the crossmember 126.

The riser board 102 includes a card slot 104 electrically connected to a motherboard connector 106. The card slot 104 extends horizontally from the riser board 102. The opening 128 of the first riser bracket piece 120 is sized to receive the card slot 104 of the riser board 102. The riser board 102 can be coupled to the first riser bracket piece 120 via fasteners 108A and 108B. In some implementations, fasteners 108A and 108B are screws that can be screwed into threaded apertures 109A and 109B in the riser board 102, and threaded apertures 129A and 129B in the first riser bracket piece 120. In some implementations, an opening 125 can be defined in the horizontal wall 122. The opening 125 can be used, for example, to access the card slot 104 of the riser board 102 from above. The opening 125 can also serve as an anchoring point for any other structure that may need to be connected to the riser bracket 100.

A computer card can be inserted into the card slot 104. The card slot 104 electrically connects the inserted computer card to the motherboard connector 106. The motherboard connector 106 can then be inserted into an expansion card slot on a motherboard. This arrangement electrically connects the computer card to various components and devices electrically connected to the motherboard. The computer card can be a peripheral component interconnect (PCI) card, a peripheral component interconnect express (PCIe) card, an industry standard architecture (ISA) card, a graphics processing unit (GPU) card, or any other suitable type of card.

The computer card can also be any format, such as a full-height full-length (FHFL) card, a full-height half-length (FHHL) card, a half-height full-length (HHFL) card, a half-height half-length (HHHL) card, a low profile (LP) card, or any other suitable format.

The second riser bracket piece 150 includes a generally horizontal wall 152 and two generally vertical walls 154A and 154B that are spaced from each other. The vertical wall 154A extends downward from a first end 123A of the horizontal wall 152, and the vertical wall 154B extends downward from a second end 123B of the horizontal wall 152. A crossmember 156 connects the vertical wall 154A to the vertical wall 154B. A generally rectangular opening 158 is defined between the horizontal wall 152, the vertical wall 154A, the vertical wall 154B, and the crossmember 156. The first riser bracket piece 120 and the second riser bracket piece 150 are disposed such that the horizontal wall 122 of the first riser bracket piece 120 and the horizontal wall 152 of the second riser bracket piece 150 are generally coplanar and connected to each other, for example via fasteners 101A and 101B. In some implementations, fasteners 101A and 101B can be screws that are inserted into corresponding threaded apertures in the first riser bracket piece 120 and the second riser bracket piece 150.

FIG. 1A includes a zoomed-in inset view of the vertical wall 154A of the second riser bracket piece 150. As shown, the vertical wall 154A includes a latch protrusion 160A and a card protrusion 160B. The latch protrusion 160A extends away from one surface of the vertical wall 154A toward the first riser bracket piece 120. The card protrusion 160B extends away from an opposing surface of the vertical wall 154A away from the first riser bracket piece 120. The latch protrusion 160A can be used to couple the second riser bracket piece 150 to a latch, as discussed in more detail herein. The card protrusion 160B can be used to couple the second riser bracket piece 150 to the computer card, as discussed in more detail herein. In this example, both the latch protrusion 160A and the card protrusion 160B are dome-shaped.

Figure 1B:
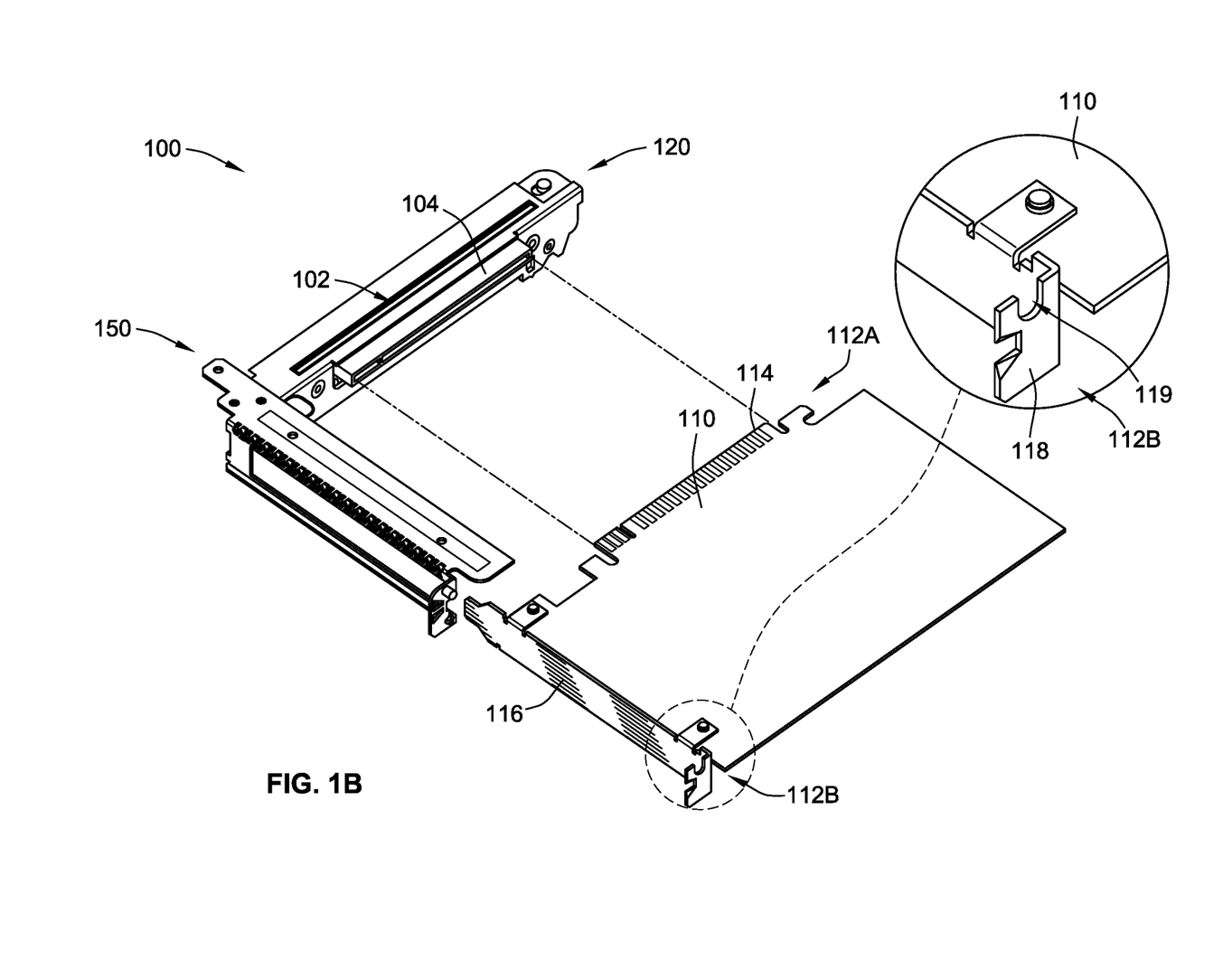
FIG. 1B is a perspective view of the riser board coupled to the riser bracket, as an example computer card is inserted into the riser board, according to aspects of the present disclosure.

FIG. 1B shows the riser bracket 100 after the card slot 104 of the riser board 102 has been inserted into the opening 128 (FIG. 1A) of the first riser bracket piece 120. A computer card 110 is being inserted into the card slot 104 of the riser board 102. The card slot 104 extends through the opening 128, into the open area formed between the first riser bracket piece 120 and the second riser bracket piece 150.

A first edge 112A of the computer card 110 is positioned generally parallel to the first riser bracket piece 120. A second edge 112B of the computer card 110 is positioned generally parallel to the second riser bracket piece 150. The first edge 112A includes a card connector 114 that can be inserted into the card slot 104 of the riser board 102. The card connector 114 includes golden finger connectors that may contact corresponding contacts in the card slot 104. The second edge 112B includes a frame piece 116 that extends substantially the entire length of the second edge 112B. The frame piece 116 can be a separate component coupled to the computer card 110, or can be integrally formed with the computer card 110. FIG. 1B includes a zoomed-in inset view of one end of the second edge 112B of the computer card 110. At this end of the second edge 112B, the frame piece 116 terminates in a vertical wall 118 that includes a slot 119.

Figure 1C:
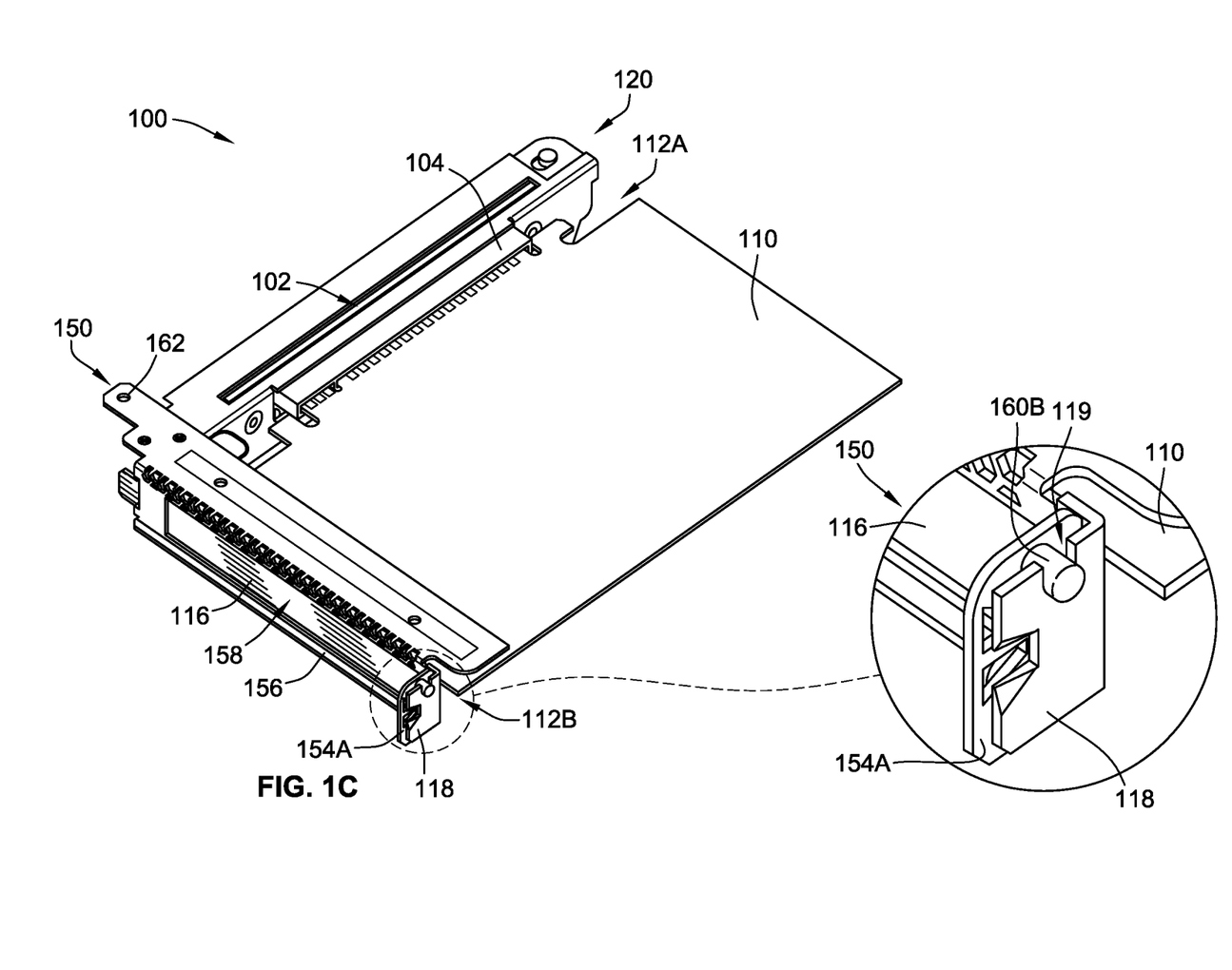
FIG. 1C is a perspective view of the riser bracket supporting the computer card when the computer card is inserted into the riser board, according to aspects of the present disclosure.

FIG. 1C shows the riser bracket 100 after the computer card 110 has been inserted into the card slot 104 of the riser board 102. Because the card connector is inserted into the card slot 104, the first riser bracket piece 120 generally supports the first edge 112A of the computer card 110. The vertical wall of the frame piece 116 is coupled to the vertical wall 154A of the second riser bracket piece 154A, and the second riser bracket piece 150 thus generally supports the second edge 112B of the computer card 110. In some implementations, the frame piece 116 of the computer card 110 extends through the opening 158 (FIG. 1A) in the second riser bracket piece 150 and rests on the crossmember 156, which thus aids in supporting the second edge 112B of the computer card. In other implementations, the frame piece 116 extends through the opening 158 but does not rest on the crossmember 156. In still other implementations, the frame piece 116 is positioned generally adjacent to the opening 158, but does not extend through the opening 158. In these implementations. The second riser bracket piece 150 can also include a tab 162 that can be used to couple the second riser bracket piece 150 to a mounting point on the motherboard, or to other components.

FIG. 1C includes a zoomed-in inset view that illustrates how the computer card 110 is coupled to the second riser bracket piece 150. When the computer card 110 is inserted into the card slot 104, the vertical wall 154A of the second riser bracket piece 150 generally abuts the vertical wall 118 of the frame piece 116. The card protrusion 160B is aligned with the slot 119 defined in the vertical wall 118. Thus, the card protrusion 160B can slide into the slot 119 when the computer card 110 is inserted into the card slot 104. In some implementations, the card protrusion 160B and the slot 119 are sized such that the card protrusion 160B is retained in the slot 119 via a friction fit. In other implementations, the base of the card protrusion 160B is indented slightly, such that the portion of the vertical wall 118 that forms the perimeter of the slot 119 fits into this indentation, so that the card protrusion 160B is retained in the slot 119. In still other implementations, the vertical wall 118 includes an aperture instead of the slot 119. In these implementations, the aperture is not open at one end like the slot 119, but rather is enclosed on all sides by portions of the vertical wall 118. The card protrusion 160B extends through the aperture when the computer card 110 is inserted into the card slot 104. In any of these implementations, the interaction between the card protrusion 160B and the slot 119 (and/or aperture) can aid in supporting the computer card 110.

Figure 2:
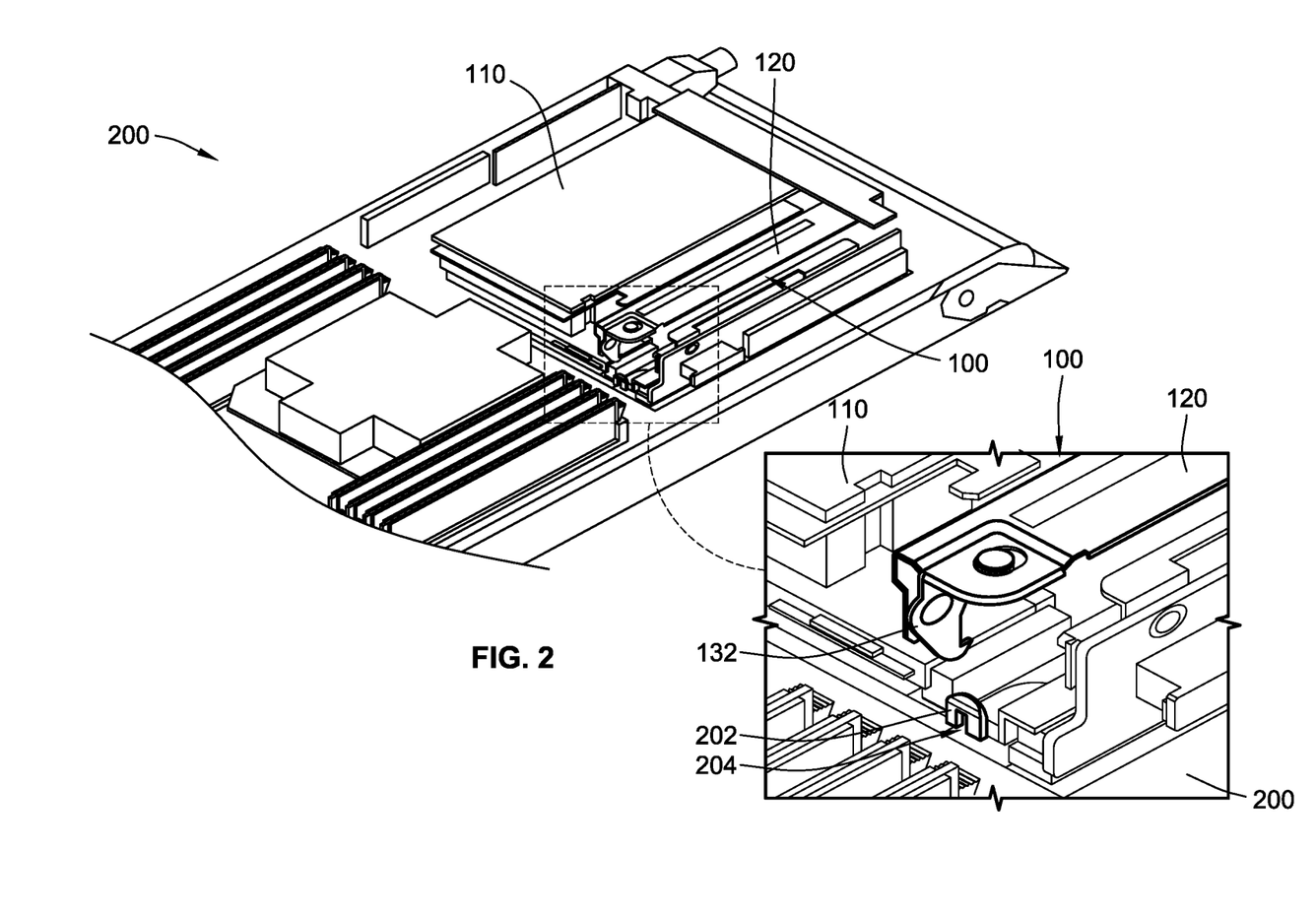
FIG. 2 is a perspective view of the riser bracket and the computer card placed onto a motherboard, and of a first latch configured to couple the riser bracket to the motherboard, according to aspects of the present disclosure.

FIG. 2 shows the riser bracket 100 and the computer card 110 as they are being placed onto a motherboard 200, so that the computer card 110 can be electrically connected to the motherboard 200 through the riser board. The motherboard 200 can be disposed in a housing of a computing system, such as a server system. As shown in the magnified inset view, the motherboard connector 106 of the riser board can be inserted into a corresponding connector on the motherboard 200 to electrically connect the computer card 110 to various components of the motherboard 200. These components can include processors, memory devices, mass storage devices, etc.

The magnified inset view also shows a latch 132 that is coupled to the first riser bracket piece 120. The latch 132 is configured to rotate between a latched position and an unlatched position. In the latched position, the latch 132 couples the first riser bracket piece 120 and the computer card 110 to a first mounting point 202 of the motherboard 200. As shown in FIG. 2, the first mounting point 202 of the motherboard 200 is generally an arch-shaped structure that defines an opening 204.

In the latched position, a portion of the latch 132 extends through the opening 204, such that the latch 132 aids in preventing the computer card 110 and the riser bracket 100 from being removed from the motherboard 200. In the unlatched position, this portion of the latch 132 is retracted from the opening 204, such that the latch 132 does not prevent the computer card 110 and the riser bracket 100 from being removed from the motherboard 200. The magnified inset view of FIG. 2 shows the latch 132 in the unlatched position when the riser board 102 and the computer card 110 are positioned just above the motherboard 200.

Figure 3A:
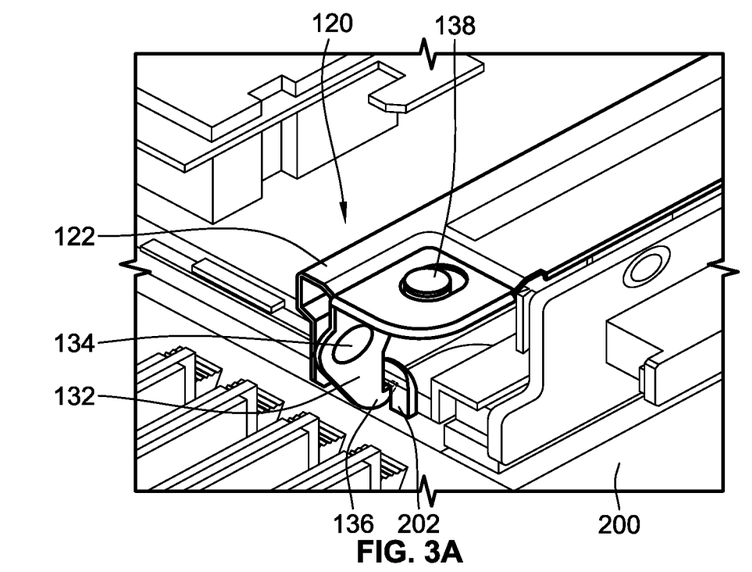
FIG. 3A is a perspective view of the first latch in a latched position, according to aspects of the present disclosure.
Figure 3B:
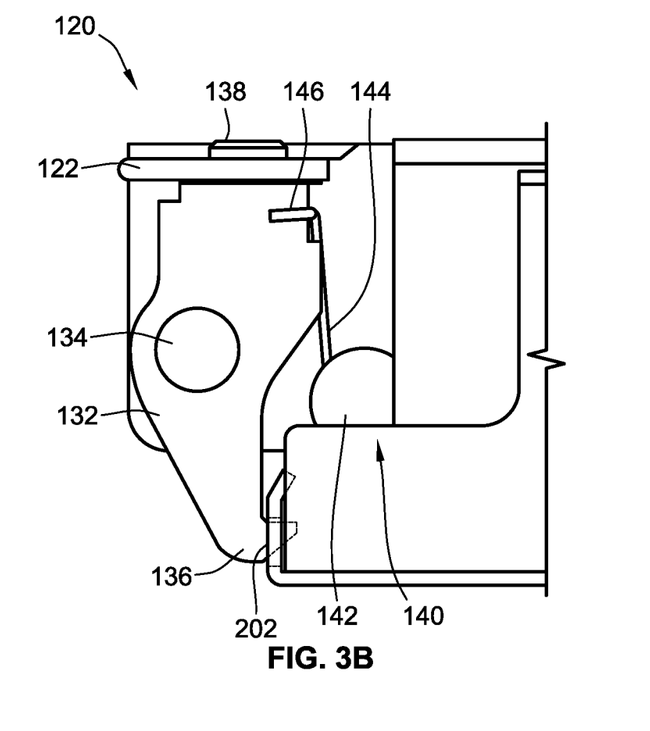
FIG. 3B is a cross-sectional view of the first latch in the latched position, according to aspects of the present disclosure.

FIG. 3A shows a perspective view of the latch 132 in the latched position. FIG. 3B shows a cross-sectional view of the latch 132 in the latched position. As shown in FIGS. 3A and 3B, the latch 132 is coupled to the vertical wall 124A of the first riser bracket piece 120 via a pivot pin 134. The latch 132 is able to rotate about the pivot pin 134, and thus is pivotally or rotatably coupled to the first riser bracket piece 120. The lower end of the latch 132 forms a hook portion 136. In the latched position, the hook portion 136 extends through the opening of the arch that forms first mounting point 202 of the motherboard 200. The hook portion 136 is thus disposed beneath the arch of the first mounting point 202. Contact between the hook portion 136 and the first mounting point 202 thus aids in preventing the computer card from being removed in an upward direction away from the motherboard 200, when the latch 132 is in the latched position. In some implementations, the bottom of the latch 132 rests on the motherboard 200 when the latch 132 is in the latched position. The latch 132 thus also aids in supporting the weight of the computer card, and can prevent the computer card from undergoing any undesired movement.

In some implementations, the hook portion 136 curves such that when the latch 132 is in the latched position, the arch of the first mounting point 202 is positioned between the tip of the hook portion 136 and the rest of the latch 132. Thus, the latch 132 can also aid in preventing the computer card 110 from being removed in a lateral direction away from the motherboard 200, when the latch 132 is in the latched position.

A top portion 138 of the latch 132 extends upward through the horizontal wall 122 of the first riser bracket piece 120. The top portion 138 is thus accessible to a user to move the latch 132 between the latched position and the unlatched position. As the latch 132 rotates about the pivot pin 134, the top portion 138 slides relative to the horizontal wall 122. Thus, a user can physically manipulate the top portion 138 to cause the top portion 138 to slide relative to the horizontal wall 122, which in turn causes the latch 132 to rotate about the pivot pin 134 between the latched position and the unlatched position.

The riser bracket 100 also includes a torsion spring 140 used to bias the latch 132 in the latched position. The torsion spring 140 includes a main body 142 coupled to the vertical wall 124A, and a coil 144 coupled to the main body 142. The coil 144 is generally wound about the main body 142 and extends upward to contact the latch 132. An upper portion 146 of the coil 144 can wrap around the latch 132 to ensure that the coil 144 maintains contact with the latch 132 as the latch 132 moves. When the latch 132 is in the latched position, as shown in FIGS. 3A and 3B, the coil 144 is in a relaxed state, i.e., a state in which the coil 144 exerts minimal or no force on the latch 132.

Figure 4A:
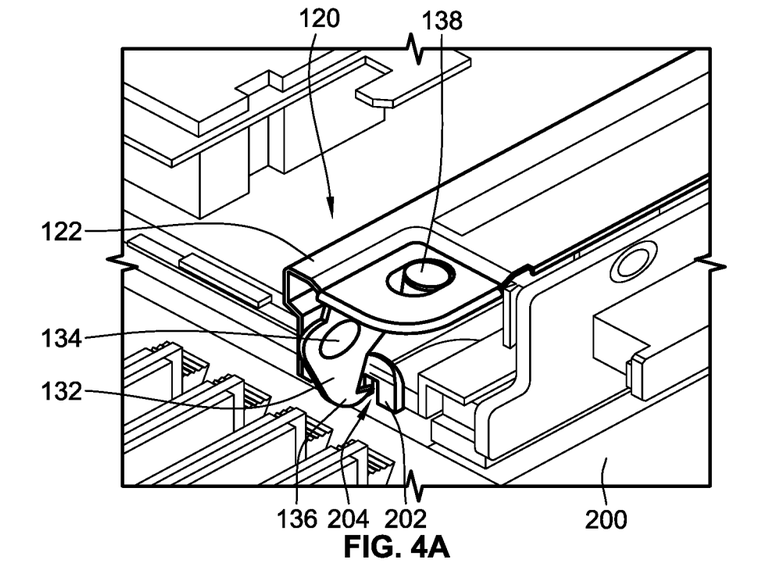
FIG. 4A is a perspective view of the first latch in an unlatched position, according to aspects of the present disclosure.
Figure 4B:
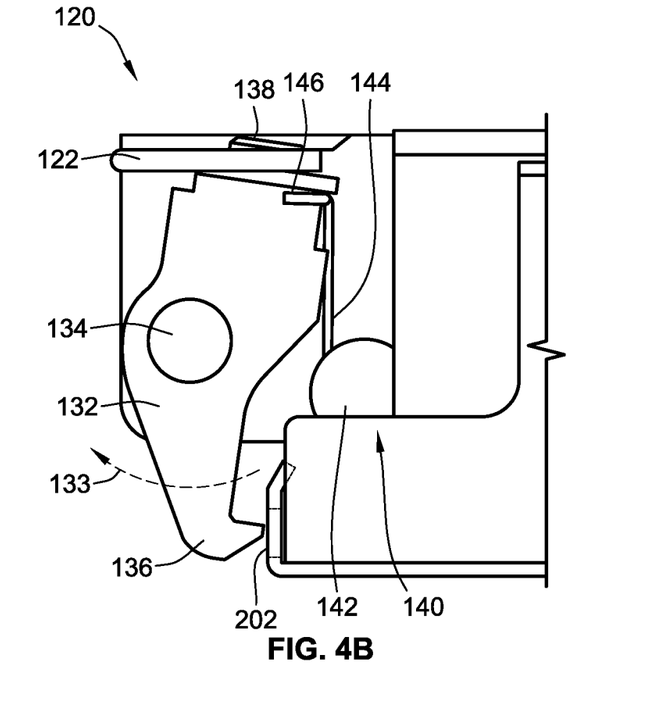
FIG. 4B is a cross-sectional view of the first latch in the unlatched position, according to aspects of the present disclosure.

FIG. 4A shows a perspective view of the latch 132 after the latch 132 has been moved to the unlatched position. FIG. 4B shows a cross-sectional view of the latch 132 in the unlatched position. As shown in FIGS. 4A and 4B, the top portion 138 of the latch 132 has been moved relative to the horizontal wall 122 of the first riser bracket piece 120. When the top portion 138 moves in this manner, the latch 132 rotates about the pivot pin 134 in the direction of arrow 133.

This rotation of the latch 132 causes the hook portion 136 of the latch 132 to move away from the first mounting point 202 of the motherboard 200. The hook portion 136 thus does not extend through the opening 204 in the first mounting point 202 when the latch 132 is in the unlatched position, and is not positioned underneath the arch formed by the first mounting point 202.

As shown in FIG. 4B, when the latch 132 is moved to the unlatched position, the upper half of the latch 132 moves toward the coil 144 of the torsion spring 140. Because the upper portion 146 of the coil 144 is wrapped around the latch 132, the coil 144 maintains contact with the latch 132. The movement of the latch 132 compresses the coil 144 in a rotational manner about the main body 142. Compression of the coil 144 causes the coil 144 to impart a force on the latch 132. The force imparted on the latch 132 by the coil 144 biases the latch 132 back toward the latched position. The amount of force imparted onto the latch 132 when the latch 132 is in the unlatched position is greater than the amount of force imparted onto the latch 132 when the latch 132 is in the latched position, regardless of whether the coil 144 imparts a force on the latch 132 when the latch 132 is in the latched position.

Figure 5A:
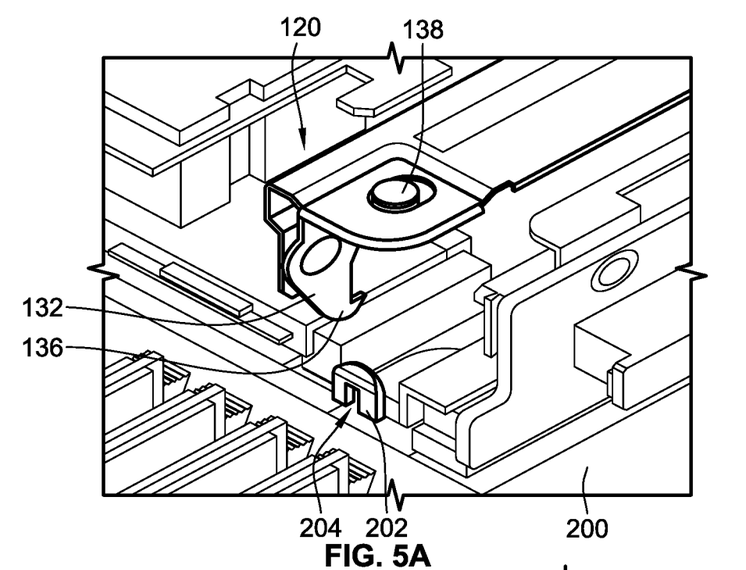
FIG. 5A is a perspective view of the first latch in the unlatched position as the riser bracket and the computer card are removed from the motherboard, according to aspects of the present disclosure.
Figure 5B:
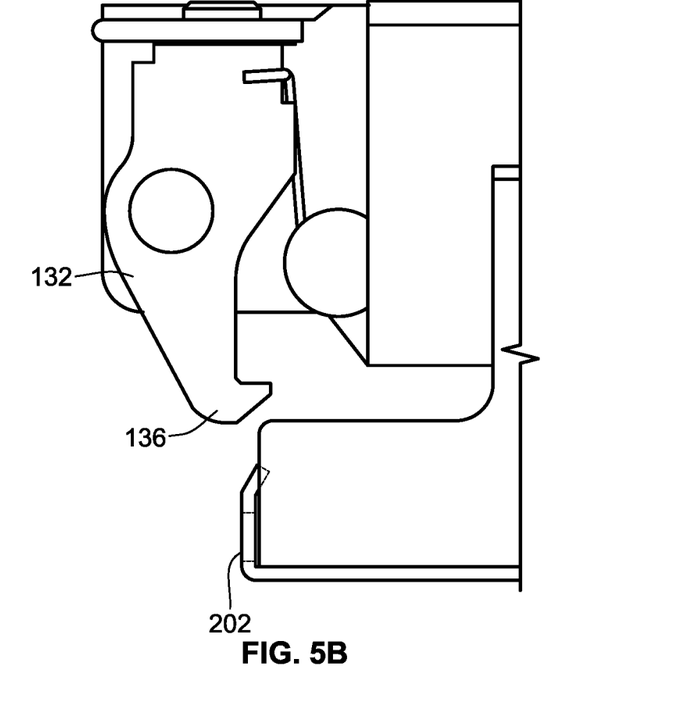
FIG. 5B is a cross-sectional view of the first latch in the unlatched position as the riser bracket and the computer card are removed from the motherboard, according to aspects of the present disclosure.

FIG. 5A shows a perspective view of the latch 132 as the riser bracket and the computer card are being removed from the motherboard 200. FIG. 5B shows a cross-sectional view of the latch 132 as the riser bracket and the computer card are being removed from the motherboard 200. Because the hook portion 136 of the latch 132 is no longer inserted through the opening 204 in the first mounting point 202, the latch 132 can move upwards without contacting the upper part of the arch formed by the first mounting point 202. The latch 132 thus does not prevent the riser board and the computer card from being moved upward off of the motherboard 200 when the latch 132 is in the unlatched position.

While FIGS. 3A-5B show the latch 132 as being able to rotate between the latched position and the unlatched position, the latch 132 can also have other configurations. For example, in some implementations, the latch 132 is coupled to the first riser bracket piece 120 so that the latch 132 slides between the latched position and the unlatched position. In these implementations, the top portion 138 of the latch 132 can still be configured to slide relative to the horizontal wall 122 of the first riser bracket piece 120, as shown in FIGS. 3A, 3B, 4A, and 4B. The coil 144 of the torsion spring 140 can also still be configured to bias the latch 132 towards the latched position.

Figure 6:
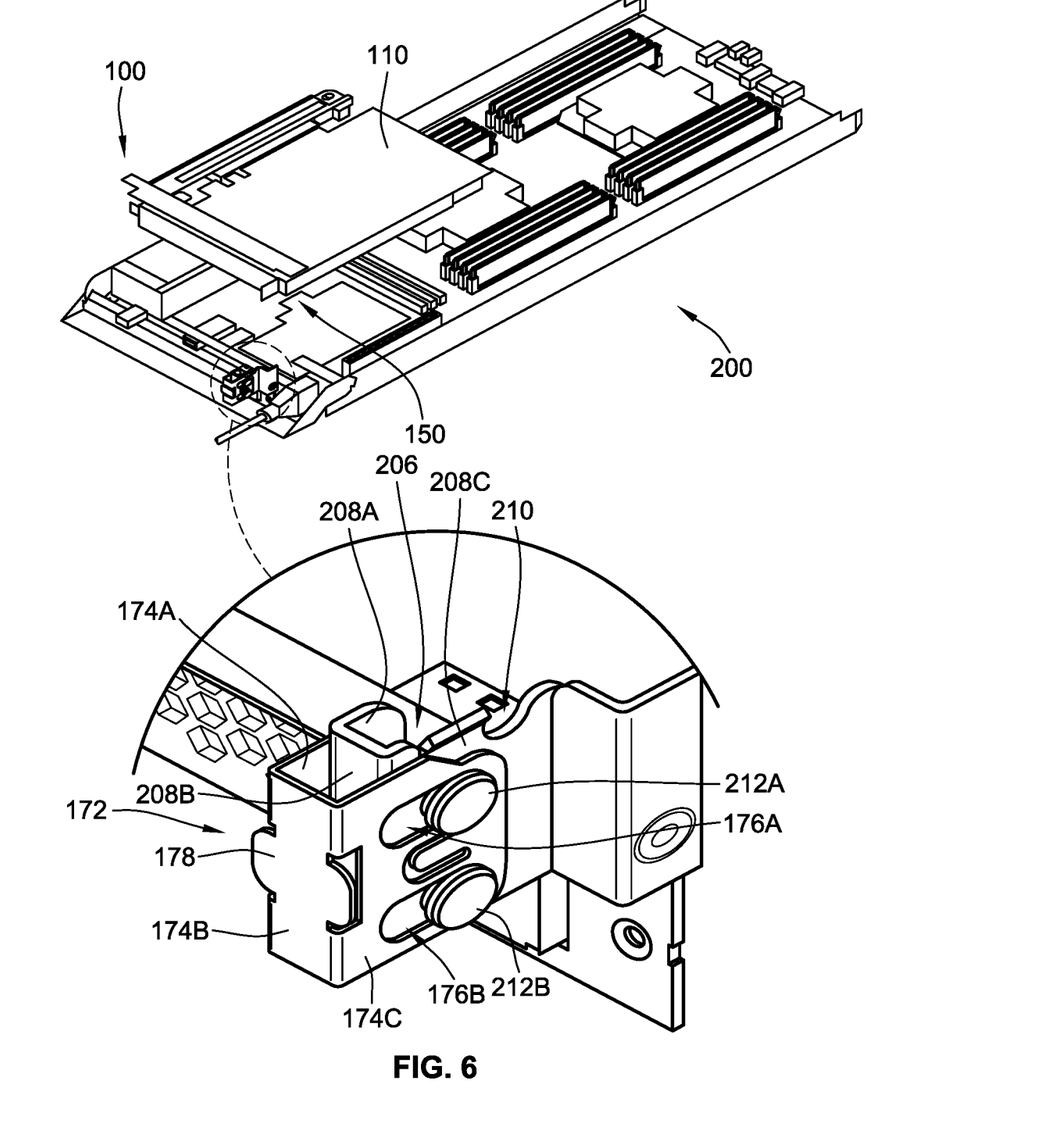
FIG. 6 is a perspective view of the riser bracket and the computer card being placed onto a motherboard, and of a second latch configured to couple the riser bracket to the motherboard, according to aspects of the present disclosure.

FIG. 6 shows the riser bracket 100 and the computer card 110 as they are being placed onto the motherboard 200, from a different angle than that shown in FIG. 2. FIG. 6 also shows a magnified inset view of a latch 172 that is coupled to a second mounting point 206 of the motherboard 200. The latch 172 is configured to couple the second riser bracket piece 150 to the second mounting point 206. The second mounting point 206 is a generally U-shaped structure formed from walls 208A, 208B, and 208C. In some implementations, the wall 208C can define a slot 210 into which the card protrusion 160B (FIG. 1A) of the second riser bracket piece 150 can fit. The wall 208C also include two latch protrusions 212A and 212B that are used to couple the latch 172 to the second mounting point 206.

The latch 172 has a similar U-shape as that of the second mounting point 206. The U-shape of the latch 172 is formed from walls 174A, 174B, and 174C. The wall 174C includes two channels 176A and 176B. The channel 176A is sized to receive the latch protrusion 212A of the wall 208A of the second mounting point 206. The channel 176B is sized to receive the latch protrusion 212B of the wall 208A of the second mounting point 206. The latch protrusions 212A and 212B are thus used to couple the latch 172 to the second mounting point 206. The latch protrusions 212A and 212B are also able to slide within the channels 176A and 176B, which allows the latch 172 to slide between the latched position and the unlatched position. The latch 172 can also include a handle 178 that aids a user in grasping the latch 172 to manually move the latch 172 between the latched position and the unlatched position.

In the unlatched position shown in FIG. 6, the wall 174B of the latch 172 is spaced apart from the wall 208B of the second mounting point 206. In the latched position, the wall 174B of the latch 172 is positioned closer to the wall 208B than when in the unlatched position. In some implementations, the wall 174B of the latch 172 contacts the wall 208B when in the unlatched position.

While FIG. 6 shows the latch 172 as a distinct component that couples the second riser bracket piece 150 to the second mounting point 206, in other implementations, the latch 172 can be part of the second riser bracket piece 150. For example, the latch 172 may be formed as an integral part of the vertical wall 154A of the second riser bracket piece 150. In these implementations, the vertical wall 154A would generally not need the separate latch protrusion 160A (as shown in FIG. 1) to couple the second riser bracket piece 150 to the latch 172. In some implementations, the latch 132 (FIG. 2) could be formed as part of the second riser bracket piece 150, instead of the first riser bracket piece 120. In these implementations, the latch 132 would generally be formed at the opposite end of the second riser bracket piece 150 as the latch 172.

Figure 7A:
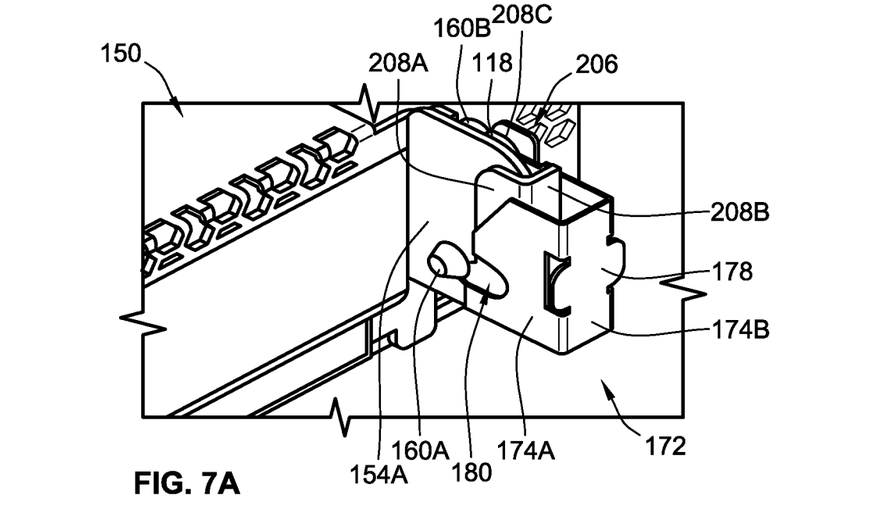
FIG. 7A is a perspective view of the second latch in an unlatched position, according to aspects of the present disclosure.

FIG. 7A shows a perspective view of the latch 172 in the unlatched positioned after the riser board and the computer card have been placed onto the motherboard. As shown, the vertical wall 154A of the second riser bracket piece 150 is coupled to the vertical wall 118 of the computer card by way of the card protrusion 160B being disposed in the slot 119 (FIG. 1C) of the vertical wall 118. When the computer card is placed onto the motherboard, the vertical wall 118 and the vertical wall 154A are positioned between the wall 208A and the wall 208C of the second mounting point 206.

The wall 174A of the latch 172 defines a slot 180 that is sized to receive the latch protrusion 160A extending from the vertical wall 154A of the second riser bracket piece 150. In the unlatched position shown in FIG. 7A, the latch 172 is pulled back from the second mounting point 206, such that the wall 174B of the latch 172 is spaced apart from the wall 208B. The slot 180 of the latch 172 is also spaced apart from the latch protrusion 160A, and the latch protrusion 160A is thus not positioned in the slot 180. Thus, in the unlatched position, the latch 172 does not couple the vertical wall 118 of the computer card and the vertical wall 154A of the second riser bracket piece 150 to the second mounting point 206 of the motherboard.

Figure 7B:
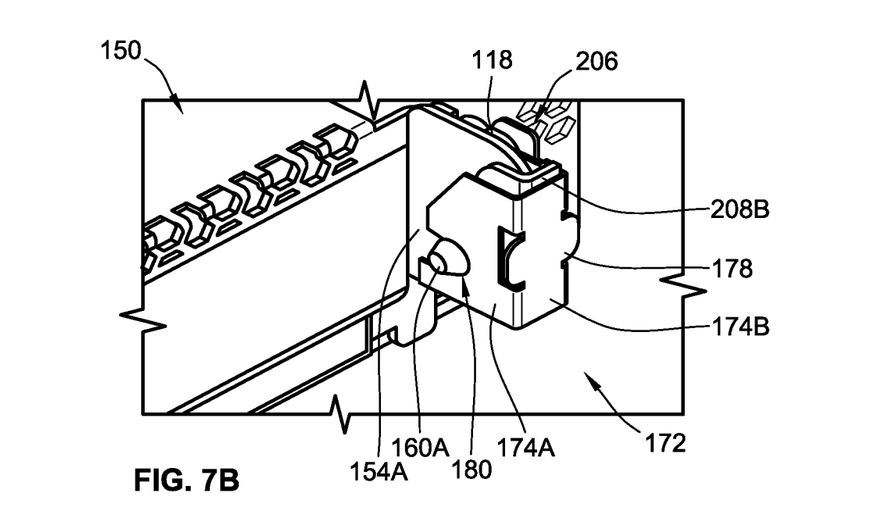
FIG. 7B is a perspective view of the second latch in a latched position, according to aspects of the present disclosure.

FIG. 7B shows a perspective view of the latch 172 in the latched position. In the latched position, the latch 172 is moved towards the second mounting point 206. As the wall 174B of the latch moves toward the wall 208B, the slot 180 moves toward and receives the latch protrusion 160A. In some implementations, the latch protrusion 160A and the slot 180 are sized such that the latch protrusion 160A is retained in the slot 180 via a friction fit. In other implementations, the base of the latch protrusion 160A is indented slightly, such that the portion of the wall 174A that forms the perimeter of the slot 180 fits into this indentation so that the latch protrusion 160A is retained in the slot 180. In the latched position, the latch 172 couples the vertical wall 118 of the computer card and the vertical wall 154A of the second riser bracket piece 150 to the second mounting point 206 of the motherboard. The latch 172 thus secures the computer card to the motherboard, and aids in preventing the computer card from being inadvertently removed from the motherboard. The latch 172 also aids in supporting the weight of the computer card, and can prevent the computer card from undergoing any undesired movement.

Thus, when the riser bracket 100 and the computer card 110 are placed onto the motherboard 200 (as shown in FIGS. 2 and 6), the first riser bracket piece 120 supports a first edge 112A of the computer card 110, and the second riser bracket piece 150 supports a second edge 112B of the computer card 110 (both shown in FIG. 1C). The first riser bracket piece 120 is coupled to the riser board 102, which in turn receives a card connector 114 of the computer card 110 in a card slot 104 (FIG. 1B). The first riser bracket piece 120 is thus coupled to the computer card 110. The first riser bracket piece 120 is also coupled to a first mounting point 202 of the motherboard 200 via the latch 132 (as shown in FIGS. 3A and 3B). The second riser bracket piece 150 is coupled to a portion of the computer card 110, and to the second mounting point 206 of the motherboard 200 via a latch 172 (as shown in FIGS. 7A and 7B). The latch 132 can move between a latched position (FIGS. 3A and 3B) and an unlatched position (FIGS. 4A and 4B). The latch 172 can move between an unlatched position (FIG. 7A) and a latched position (FIG. 7B). In their latched positions, the latch 132 and the latch 172 aid in securing the computer card 110 to the motherboard 200, and aid in preventing the computer card 110 from being inadvertently removed from the motherboard 200. The latch 132 and the latch 172 also aid in stabilizing the computer card 110 within the motherboard 200, and in preventing the computer card 110 from undergoing any undesired movement.

In additional implementations, the location and types of latches used with the riser bracket 100 can be varied, so long as the motherboard includes the correct mounting points in the required locations. For example, in some implementations, the latch 132 and the latch 172 can be swapped. In these implementations, the latch 132 can be used to couple the second riser bracket piece 150 to the motherboard 200, and the latch 172 can be used to couple the first riser bracket piece 120 to the motherboard 200. In other implementations, the latch 132 is used for both the first riser bracket piece 120 and the second riser bracket piece 150. In still other implementations, the latch 172 is used for both the first riser bracket piece 120 and the second riser bracket piece 150. In still other implementations, additional latches can be used.

The terminology used herein is for the purpose of describing particular embodiments only, and is not intended to be limiting of the invention. As used herein, the singular forms "a," "an," and "the" are intended to include the plural forms as well, unless the context clearly indicates otherwise. Furthermore, to the extent that the terms "including," "includes," "having," "has," "with," or variants thereof, are used in either the detailed description and/or the claims, such terms are intended to be inclusive in a manner similar to the term "comprising."

Unless otherwise defined, all terms (including technical and scientific terms) used herein have the same meaning as commonly understood by one of ordinary skill in the art. Furthermore, terms, such as those defined in commonly used dictionaries, should be interpreted as having a meaning that is consistent with their meaning in the context of the relevant art, and will not be interpreted in an idealized or overly formal sense unless expressly so defined herein.

While various embodiments of the present invention have been described above, it should be understood that they have been presented by way of example only, and not limitation. Numerous changes to the disclosed embodiments can be made in accordance with the disclosure herein, without departing from the spirit or scope of the invention. Thus, the breadth and scope of the present invention should not be limited by any of the above described embodiments. Rather, the scope of the invention should be defined in accordance with the following claims and their equivalents.

Although the invention has been illustrated and described with respect to one or more implementations, equivalent alterations, and modifications will occur or be known to others skilled in the art upon the reading and understanding of this specification and the annexed drawings. In addition, while a particular feature of the invention may have been disclosed with respect to only one of several implementations, such feature may be combined with one or more other features of the other implementations as may be desired and advantageous for any given or particular application.

What is claimed is:

1. A riser bracket for supporting a riser board and a computer card inserted into the riser board, the riser board and the computer card being positioned on a motherboard, the riser bracket comprising:
    a first riser bracket piece configured to be coupled to the riser board;
    a first latch configured to couple the first riser bracket piece to a first mounting point of the motherboard, the first latch being configured to move between a latched position and an unlatched position;
    a second riser bracket piece coupled to the first riser bracket piece; and
    a second latch configured to couple the second riser bracket piece to a second mounting point of the motherboard, the second latch being configured to move between a latched position and an unlatched position.

2. The riser bracket of claim 1, wherein a connector on a first edge of the computer card is configured to be inserted into the riser board, such that the first riser bracket piece supports the first edge of the computer card.

3. The riser bracket of claim 2, wherein the second riser bracket piece includes a crossmember, and wherein a second edge of the computer card is configured to rest on the crossmember, such that the second riser bracket piece supports the second edge of the computer card.

4. The riser bracket of claim 1, wherein the first riser bracket piece and the second riser bracket piece are arranged generally perpendicular to each other.

5. The riser bracket of claim 1, wherein the first latch is configured to rotate between the latched position and the unlatched position.

6. The riser bracket of claim 5, wherein the first latch includes a hook portion that is configured to extend through an opening in the first mounting point of the motherboard when the first latch is in the latched position.

7. The riser bracket of claim 5, wherein the first latch is biased toward the latched position.

8. The riser bracket of claim 7, further comprising a torsion spring coupled to the first riser bracket piece, wherein movement of the first latch from the latched position to the unlatched position compresses the torsion spring, thereby biasing the first latch toward the latched position.

9. The riser bracket of claim 5, wherein the first riser bracket piece includes a vertical wall and a horizontal wall extending from the vertical wall, the first latch being coupled to the vertical wall, and a top portion of the first latch extending through an opening in the horizontal wall, such that the top portion of the first latch is accessible to move the first latch between the latched position and the unlatched position.

10. The riser bracket of claim 1, wherein the second riser bracket piece includes a horizontal wall and a vertical wall extending downward from a first end of the horizontal wall, the vertical wall being configured to be coupled to a portion of the computer card.

11. The riser bracket of claim 10, wherein the vertical wall of the second riser bracket piece includes a latch protrusion extending from a first surface of the vertical wall, and a card protrusion extending from an opposing second surface of the vertical wall.

12. The riser bracket of claim 11, wherein the card protrusion of the second riser bracket piece is insertable into a slot defined by the portion of the computer card, to thereby couple the second riser bracket piece to the portion of the computer card.

13. The riser bracket of claim 11, wherein the second latch is coupled to the second mounting point of the motherboard and includes a vertical wall that defines a slot, the slot receiving the latch protrusion of the vertical wall of the second riser bracket piece therein.

14. The riser bracket of claim 13, wherein when the second latch is in the latched position, the latch protrusion is received in the slot defined by the second latch to secure the second riser bracket piece, and wherein when the second latch is in the unlatched position, the latch protrusion is not received in the slot.

15. The riser bracket of claim 11, wherein the second mounting point of the motherboard includes a protrusion, and wherein the second latch includes a vertical wall that defines a channel, the channel receiving the protrusion of the second mounting point of the motherboard.

16. The riser bracket of claim 15, wherein the protrusion of the second mounting point of the motherboard slides within the channel defined by the vertical wall of the second latch when the second latch moves between the latched position and the unlatched position.

17. The riser bracket of claim 10, wherein a second end of the horizontal wall of the second riser bracket piece is configured to be coupled to a third mounting point of the motherboard.

18. The riser bracket of claim 1, wherein the second riser bracket piece is configured to be coupled to a portion of the computer card, and wherein when the second latch is in the latched position, the second latch is coupled to both the second riser bracket piece and the second portion of the motherboard, and when the second latch is in the unlatched position, the second latch is decoupled from the second riser bracket piece.

19. The riser bracket of claim 1, wherein the first riser bracket piece is configured to support a first edge of the computer card inserted into the riser board and the second riser bracket piece is configured to support a second edge of the computer card, and wherein the second riser bracket piece is configured to be coupled to (i) a portion of the computer card and (ii) a third mounting point of the motherboard.

20. A computer system comprising:
a housing;
a motherboard disposed within the housing;
a riser board electrically connected to the motherboard;
a computer card inserted into the riser board to electrically connect the computer card to the motherboard through the riser board; and
a riser bracket configured to support the riser board and the computer card, the riser bracket including:
 a first riser bracket piece configured to be coupled to the riser board;
 a first latch configured to couple the first riser bracket piece to a first mounting point of the motherboard, the first latch being configured to move between a latched position and an unlatched position;
 a second riser bracket piece coupled to the first riser bracket piece; and
 a second latch configured to couple the second riser bracket piece to a second mounting point of the motherboard, the second latch being configured to move between a latched position and an unlatched position.

* * * * *